United States Patent
Seo et al.

(10) Patent No.: US 11,031,385 B2
(45) Date of Patent: *Jun. 8, 2021

(54) STANDARD CELL FOR REMOVING ROUTING INTERFERENCE BETWEEN ADJACENT PINS AND DEVICE INCLUDING THE SAME

(71) Applicant: Samsung Electronics Co., Ltd., Suwon-si (KR)

(72) Inventors: Jae-Woo Seo, Seoul (KR); Jin Tae Kim, Daejeon (KR); Tae Joong Song, Seongnam-si (KR); Hyoung-Suk Oh, Seoul (KR); Keun Ho Lee, Hwaseong-si (KR); Dal Hee Lee, Seoul (KR); Sung We Cho, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/725,023

(22) Filed: Dec. 23, 2019

(65) Prior Publication Data
US 2020/0126968 A1   Apr. 23, 2020

Related U.S. Application Data

(63) Continuation of application No. 15/298,586, filed on Oct. 20, 2016, now Pat. No. 10,553,574.

(30) Foreign Application Priority Data

Apr. 7, 2016 (KR) .......... 10-2016-0042588

(51) Int. Cl.
  *H01L 27/02* (2006.01)
  *H01L 27/088* (2006.01)
  (Continued)

(52) U.S. Cl.
  CPC .... *H01L 27/0207* (2013.01); *H01L 21/67138* (2013.01); *H01L 21/823475* (2013.01);
  (Continued)

(58) Field of Classification Search
  None
  See application file for complete search history.

(56) References Cited

U.S. PATENT DOCUMENTS 5,980,093 A   11/1999 Jones et al.
7,971,174 B1   6/2011 Khalsa et al.
(Continued)

*Primary Examiner* — Jack Chiang
*Assistant Examiner* — Aric Lin
(74) *Attorney, Agent, or Firm* — Harness, Dickey & Pierce, P.L.C.

(57) ABSTRACT

An integrated circuit including a first standard cell including, first transistors, the first transistors being first unfolded transistors, a first metal pin, a second metal pin, and a third metal pin on a first layer, the first metal pin and the second metal pin having a first minimum metal center-to-metal center pitch therebetween less than or equal to 80 nm, a fourth metal pin and a fifth metal pin at a second layer, the fourth metal pin and the fifth metal pin extending in a second direction, the second direction being perpendicular to the first direction, a first via between the first metal pin and the fourth metal pin, and a second via between the third metal pin and the fifth metal pin such that a first via center-to-via center space between the first via and the second via is greater than double the first minimum metal center-to-metal center pitch.

12 Claims, 13 Drawing Sheets

(51) Int. Cl.
*H01L 21/67* (2006.01)
*H01L 21/8234* (2006.01)
*H01L 23/522* (2006.01)
*H01L 23/528* (2006.01)
*H03K 19/17736* (2020.01)
*H03K 19/17764* (2020.01)
*H01L 27/118* (2006.01)
*H01L 27/092* (2006.01)
*H03K 19/00* (2006.01)
*H03K 19/20* (2006.01)
*H03K 19/21* (2006.01)

(52) U.S. Cl.
CPC ........ *H01L 23/528* (2013.01); *H01L 23/5226* (2013.01); *H01L 27/088* (2013.01); *H01L 27/0886* (2013.01); *H03K 19/17744* (2013.01); *H03K 19/17764* (2013.01); *H01L 27/092* (2013.01); *H01L 2027/11875* (2013.01); *H03K 19/0002* (2013.01); *H03K 19/20* (2013.01); *H03K 19/21* (2013.01)

(56) References Cited

U.S. PATENT DOCUMENTS

| | | | |
|---|---|---|---|
| 8,065,652 | B1 | 11/2011 | Salowe et al. |
| 8,127,263 | B2 | 2/2012 | Torvi et al. |
| 8,173,491 | B2 | 5/2012 | Law et al. |
| 8,735,857 | B2 | 5/2014 | Andreev et al. |
| 8,904,335 | B2 | 12/2014 | Yoshida et al. |
| 8,978,004 | B2 | 3/2015 | Maziasz et al. |
| 9,122,830 | B2 | 9/2015 | Yuan et al. |
| 10,553,574 | B2* | 2/2020 | Seo ................ H01L 27/0207 |
| 2006/0117276 | A1* | 6/2006 | Nishiwaki ............ G06F 30/39 716/112 |
| 2007/0022400 | A1 | 1/2007 | Kadota |
| 2009/0172628 | A1 | 7/2009 | Chyan et al. |
| 2013/0072020 | A1* | 3/2013 | Blatchford ........ H01L 21/76816 438/675 |
| 2013/0227498 | A1* | 8/2013 | Pathak ................ G06F 30/398 716/54 |
| 2013/0272056 | A1* | 10/2013 | Liaw ................ H01L 27/0207 365/154 |
| 2014/0027783 | A1* | 1/2014 | Yin ................ H01L 21/823821 257/77 |
| 2014/0038085 | A1* | 2/2014 | Chern ................ G06F 30/394 430/5 |
| 2016/0117432 | A1* | 4/2016 | Yuan ................ G06F 30/398 716/52 |

* cited by examiner

STANDARD CELL FOR REMOVING ROUTING INTERFERENCE BETWEEN ADJACENT PINS AND DEVICE INCLUDING THE SAME

CROSS-REFERENCE TO RELATED APPLICATION

This application is a continuation of U.S. application Ser. No. 15/298,586, filed on Oct. 20, 2016, claims priority under 35 U.S.C. § 119(a) from Korean Patent Application No. 10-2016-0042588 filed on Apr. 7, 2016, the disclosure of which is hereby incorporated by reference in its entirety.

BACKGROUND

Example embodiments of the inventive concepts relate to a standard cell and/or a device including the same. For example, at least some example embodiments relate to a standard cell having a structure for removing routing interference between adjacent pins and/or a device including the same.

An integrated circuit (IC) is designed using an automated layout tool which arranges standard cells and connections between the standard cells. The automated layout tool arranges the standard cells and the connections between the standard cells according to specified layout rules or design rules. The configuration of arranged standard cells and arranged connections is referred to as a device layout and is used as a basis for forming an IC device. The device layout depends on the mutability of the layout of each of the standard cells.

A standard cell includes pins placed at different metal layers. When pins (or metals) placed at one metal layer are adjacent to each other, routing interference may occur between the pins. In addition, with the miniaturization of manufacturing processes of standard cells, a violation of a minimum distance between metals defined by the layout rules or design rules may result.

SUMMARY

According to some example embodiments of the inventive concepts, there is provided an integrated circuit including a first standard cell including first transistors. The first transistors may be all first unfolded transistors. The first standard cell may include a first metal, a second metal, and a third metal placed at a first layer in a first direction successively side by side; a fourth metal and a fifth metal placed at a second layer in a second direction and separated from each other; a first via connected between the first metal and the fourth metal; and a second via connected between the third metal and the fifth metal. A first via center-to-via center space between the first via and the second via may be greater than the double of a first minimum metal center-to-metal center pitch between the first metal and the second metal. The first minimum metal center-to-metal center pitch may be equal to or less than 80 nm. The first direction may be perpendicular to the second direction.

According to other example embodiments of the inventive concepts, there is provided an integrated circuit including a layout area including first transistors. The first transistors may be all first unfolded transistors. The layout area may include a first metal, a second metal, and a third metal placed at a first layer in a first direction successively side by side; a fourth metal and a fifth metal placed at a second layer in a second direction and separated from each other; a first via connected between the first metal and the fourth metal; and a second via connected between the third metal and the fifth metal. A first via center-to-via center space between the first via and the second via may be greater than the double of a first minimum metal center-to-metal center pitch between the first metal and the second metal. The first minimum metal center-to-metal center pitch may be equal to or less than 80 nm. The first direction may be perpendicular to the second direction.

According to some other example embodiments of the inventive concepts, there is provided a method of laying out a standard cell layout using a placement and outing tool. The method includes partitioning a placement and routing area into a plurality of regions, determining whether each of the regions has routing congestion based on the number of design rule checking (DRC) violations occurring in each region, placing and routing a first standard cell in each region determined as having the routing congestion using a cell layout in a first cell library, and placing and routing a second standard cell in each region determined as not having the routing congestion using a cell layout in a second cell library.

According to some other example embodiments of the inventive concepts, a placement and routing tool may include a memory configured to store at least a first cell library and a second cell library; and a processor configured to, categorize regions of a routing area as one of congested regions and non-congested regions based on a number of design rule checking (DRC) violations therein, place and route a first standard cell in each of the congested regions using a cell layout from the first cell library, and place and route a second standard cell in each of the non-congested regions using a cell layout from the second cell library.

BRIEF DESCRIPTION OF THE DRAWINGS

The above and other features and advantages of the inventive concepts will become more apparent by describing in detail some example embodiments thereof with reference to the attached drawings in which.

DETAILED DESCRIPTION

Example embodiments of the inventive concepts now will be described more fully hereinafter with reference to the accompanying drawings, in which some example embodiments are shown. In designing semiconductor, standard cell methodology is a method of designing application specific integrated circuits (ASICs) having normal digital-logic characteristics. A standard cell may refer to a group of transistors providing a Boolean logic function and/or a storage function (e.g., the function of a flip-flop or a latch) and interconnect structures. The Boolean logic function may be implemented as a tri-state logic circuit, an XOR gate, an XNOR gate, an AND gate, an OR gate, an inverter, a NAND gate, a NOR gate, an AND-OR-inverter (AOI) gate, or an OR-AND-inverter (OAI) gate, but example embodiments of the inventive concepts are not restricted to these examples. The Boolean logic function may refer to a first standard cell or a second standard cell which will be described below.

Here, if routing interference exists between an A-pin (or A-metal) included in a lower metal layer and a B-pin (or a B-metal) included in an upper metal layer, then the routing of the A-pin may be considered when the B-pin is routed. Also, if routing interference does not exist between the A-pin and the B-pin, then the B-pin may be routed regardless of the routing of the A-pin. Existence of routing interference means that design rule check (DRC) violation is highly likely to occur.

Figure 1:
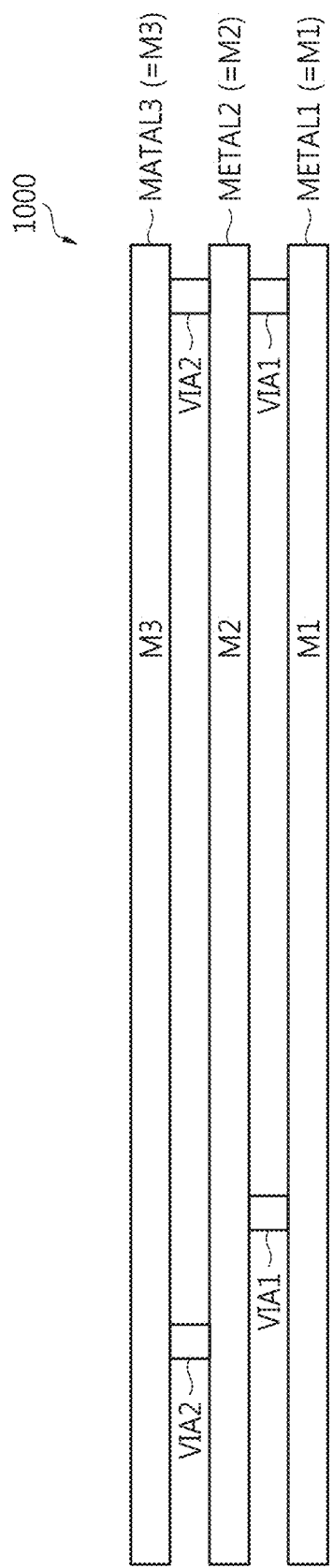
FIG. 1 is a conceptual diagram of a printed circuit board including metal layers and vias.

FIG. 1 is a conceptual diagram of a printed circuit board (PCB) including metal layers and vias.

Referring to FIG. 1, the PCB 1000 is a PCB included in an integrated circuit (IC). The PCB 1000 may include a plurality of metal layers M1, M2, and M3, first vias VIA1 electrically connecting the first metal layer M1 and the second metal layers M2, and second vias VIA2 electrically connecting the second metal layer M2 and the third metal layers M3. Although three metal layers M1 through M3 and a plurality of the vias VIA1 and VIA2 in the embodiments illustrated in FIG. 1, example embodiments of the inventive concepts are not restricted to.

The first metal layer M1 is a lower metal layer and the second metal layer M2 is an upper metal layer placed on or above the first metal layer M1. At least one metal layer may be placed between the first metal layer M1 and the second metal layer M2. Each via VIA2 illustrated in FIG. 1 connects a pin placed at the second metal layer M2 with a pin placed at the third metal layer M3.

Figure 2:
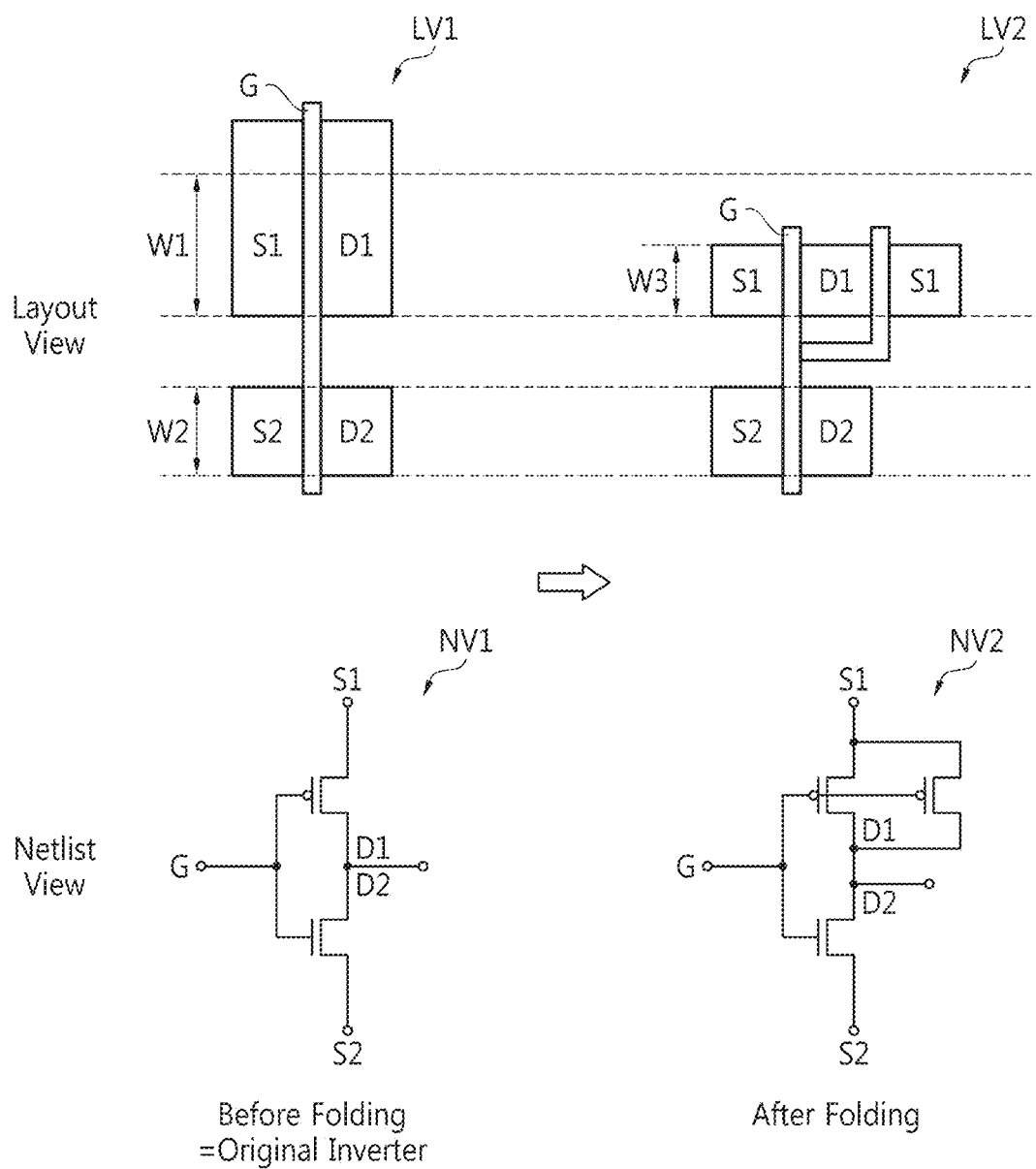
FIGS. 2A and 2B are conceptual diagrams for explaining an unfolded transistor structure and a folded transistor structure.

FIGS. 2A and 2B are conceptual diagrams for explaining an unfolded transistor structure and a folded transistor structure.

Referring to FIGS. 2A and 2B, transistor folding is a technique for conserving a semiconductor area. The transistor folding is a process of transforming a single transistor into smaller and multiple transistors called folds, fingers, or legs, as shown in FIG. 2B. The folds, fingers, or legs are connected in parallel and need to be placed together on one semiconductor chip. Transistors are folded to meet a maximum height requirement.

FIG. 2A shows a layout view LV1 and a netlist view NV1 of an inverter including transistors before folding. FIG. 2B shows a layout view LV2 and a netlist view NV2 of an inverter including transistors after folding. In FIGS. 2A and 2B, reference characters S1 and S2 denote source regions, reference characters D1 and D2 denote drain regions, a reference character G denotes a gate electrode, a reference character W1 denotes the height of a P-row or P-channel metal oxide semiconductor (PMOS) transistor, a reference character W2 denotes the height of an N-row or N-channel metal oxide semiconductor (NMOS) transistor, and a reference character W3 denotes the height of PMOS transistors having a folded structure. The schematic view NV2 is equivalent to the schematic view NV1.

Figure 3:
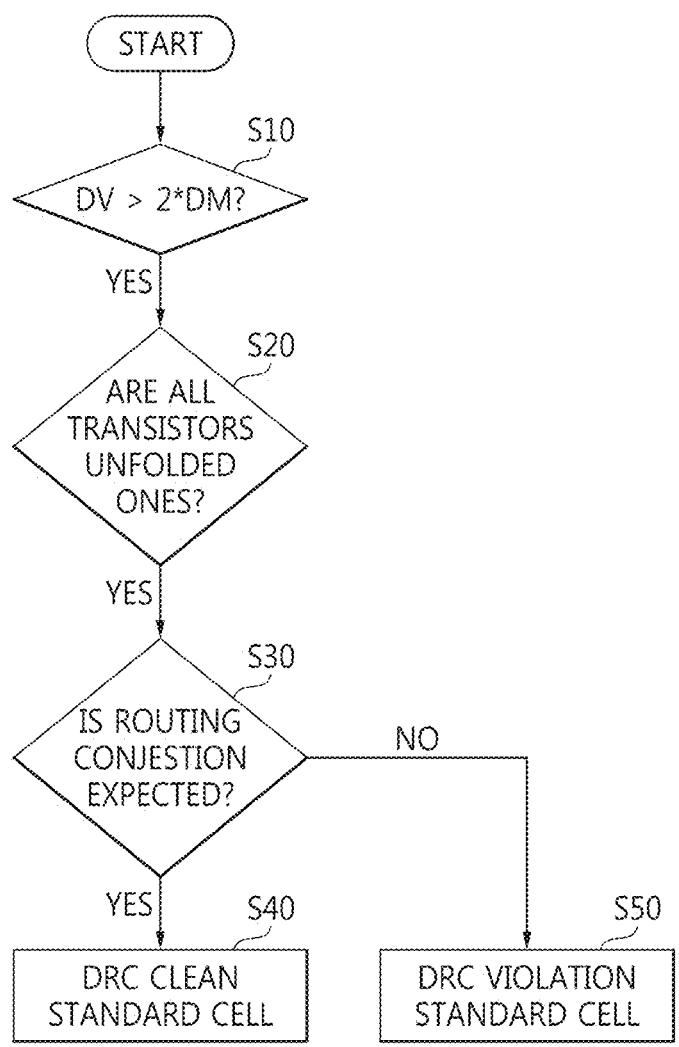
FIG. 3 is a flowchart for explaining generation conditions for a first standard cell and generation conditions for a second standard cell.

FIG. 3 is a flowchart for explaining generation conditions for a first standard cell and generation conditions for a second standard cell.

Referring to FIG. 3, in operation S10, an IC design system 150 (see FIG. 11) may determine whether a via center-to-via center space DV between a first via and a second via is greater than the double of a minimum metal center-to-metal center pitch DM between a first metal and a second metal. Here, the center-to-via center space DV generically indicates DV1 in FIG. 5, DV2 in FIG. 6, DV3 in FIG. 7, and DV4 in FIG. 8.

In operation S20, when the via center-to-via center space DV is greater than the double of the minimum metal center-to-metal center pitch DM (i.e., in case of YES in operation S10), the IC design system 150 may determine whether all transistors included in a standard cell are unfolded transistors.

In operation S30, when all transistors are unfolded transistors (i.e., in case of YES in operation S20), the IC design system 150 may determine whether routing congestion is expected in the standard cell to be placed and routed.

In operation S40, when the routing congestion is expected in the standard cell (i.e., in case of YES in operation S30), the IC design system 150 may place and route the standard cell as a first standard cell. The placement and routing of the first standard cell will be described with reference to FIGS. 6, 8, 9, and 10 later. The first standard cell may be a DRC clean standard cell or DRC violation-free standard cell. At this time, a tip-to-tip space in the first standard cell is designed to be equal to or greater than a DRC space. The tip-to-tip space and the DRC space will be described in detail with reference to FIGS. 5 through 8 later.

In operation S50, when the routing congestion is not expected in the standard cell to be placed and routed (i.e., in case of NO in operation S30), the IC design system 150 may place and route the standard cell as a second standard cell. The placement and routing of the second standard cell will be described with reference to FIGS. 5 and 7 later. The second standard cell may be a DRC violation standard cell. At this time, a tip-to-tip space in the second standard cell is designed to be less than the DRC space.

When any of the conditions in operations S10 and S20 is not satisfied, in some example embodiments of the inventive concepts, the IC design system 150 may not place and route a first standard cell and a second standard cell.

Figure 11:
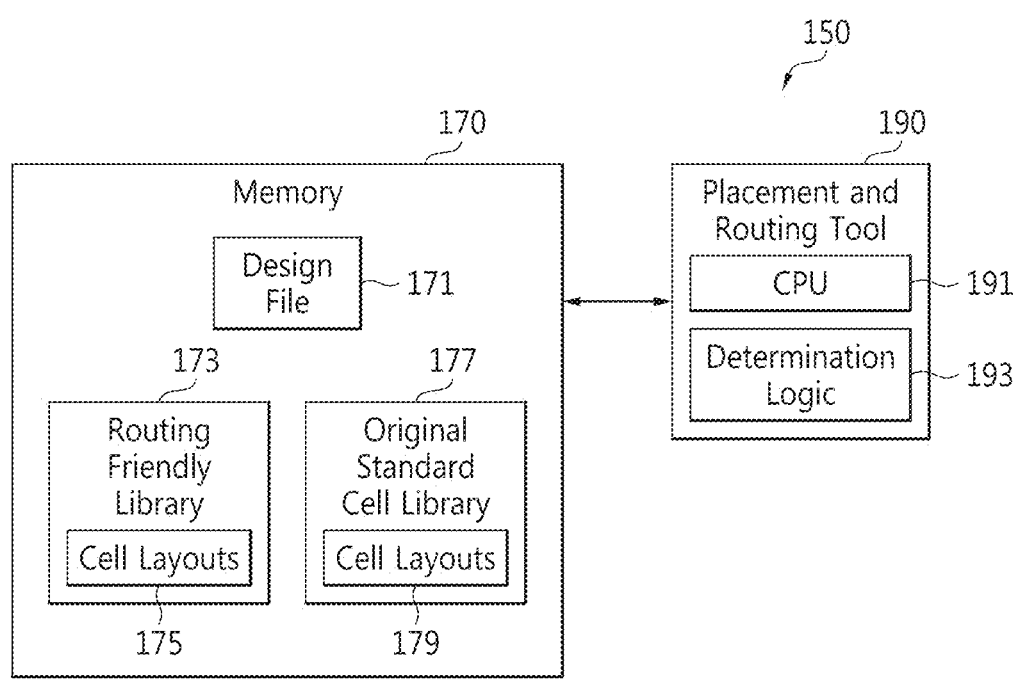
FIG. 11 is a block diagram of a design system which designs an integrated circuit including a first standard cell and a second standard cell according to some example embodiments of the inventive concepts.

Operation S10 through S50 may be performed by the IC design system 150 illustrated FIG. 11. For example, Operations S10 through S50 may be performed by a placement and routing tool 190 run in the IC design system 150.

Figure 4:
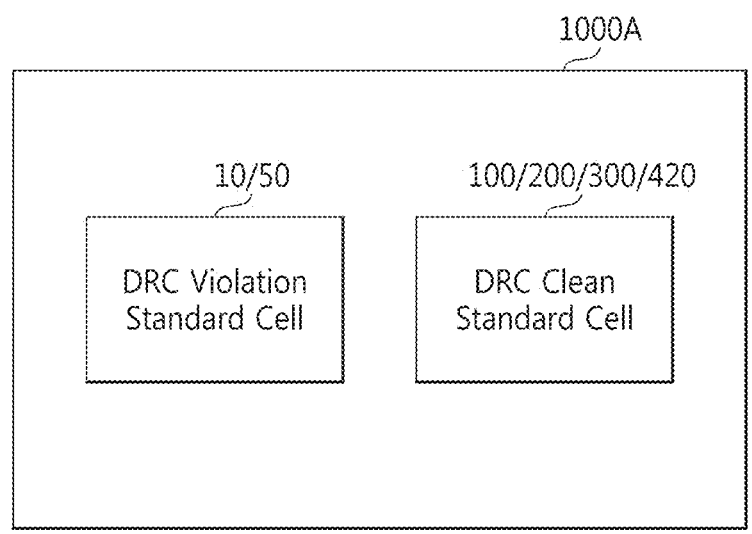
FIG. 4 is a diagram of an integrated circuit including both first and second standard cells.

FIG. 4 is a diagram of an IC 1000A including both first and second standard cells.

Referring to FIG. 4, the IC 1000A or the PCB 1000A includes both a first standard cell 100, 200, 300, or 400 and a second standard cell 10 or 50. In other words, both the first standard cell 100, 200, 300, or 400 and the second standard cell 10 or 50 are integrated together into the IC 1000A. All transistors integrated into each standard cell 10, 50, 100, 200, 300, or 400 are unfolded transistors as shown in FIG. 2A.

The IC 1000A includes a layout area into which the first standard cell 100, 200, 300, or 400 and the second standard cell 10 or 50 can be integrated. Each of the unfolded transistors included in the first standard cell 100, 200, 300, or 400 and the second standard cell 10 or 50 may be fabricated using sub-20 nm fin field effect transistor (Fin-FET) technology. However, example embodiments are not limited thereto.

FIGS. 5 to 10 illustrate conceptual diagrams of the layouts of a standard cell. In the standard cell layouts illustrated in FIGS. 5 through 10, an M1 pin is a pin that is placed or routed on the first metal layer M1 illustrated in FIG. 1 and an M2 pin is a pin that is placed or routed on the second metal layer M2 illustrated in FIG. 1. Each via of vias V1 through V8, V11 through V14, V21 through V24, 343, 347, 351, 355, 425, 429, and 457 is a first via VIA1 which connects a pin placed on the first metal layer M1 with a pin placed on the second metal layer M2 in FIG. 1. Here, a pin may be a metal or a metal body.

The first metal layer M1 is a lower metal layer and the second metal layer M2 is an upper metal layer placed on or above the first metal layer M1. At least one metal layer may be placed between the first metal layer M1 and the second metal layer M2. Each via VIA2 illustrated in FIG. 1 connects a pin placed at the second metal layer M2 with a pin placed at the third metal layer M3.

Figure 5:
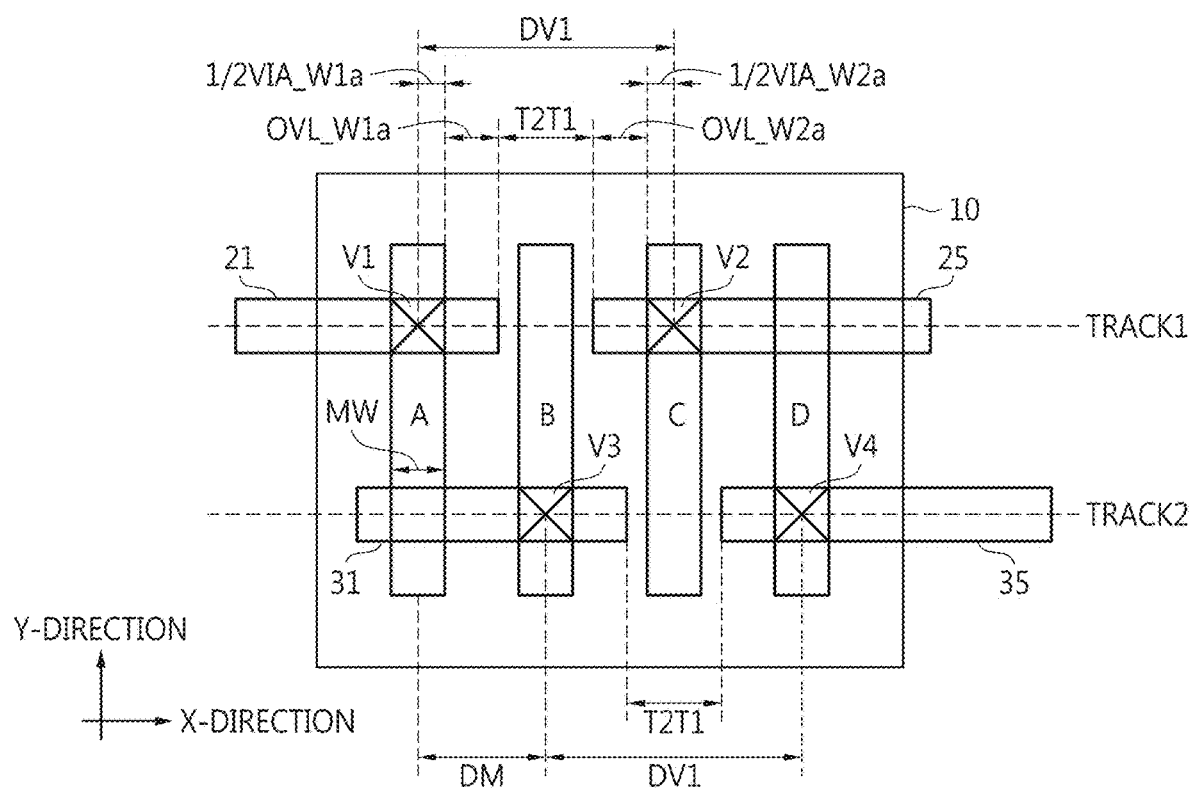
FIG. 5 is a conceptual diagram of the layout of a second standard cell from which routing interference between internal pins is not removed according to the conditions illustrated in FIG. 3.

FIG. 5 is a conceptual diagram of the layout of the second standard cell 10 from which routing interference between internal pins is not removed according to the conditions illustrated in FIG. 3.

Referring to FIG. 5, when the routing congestion is not expected (i.e., in case of NO in operation S30), the IC design system 150 may place and route the second standard cell 10. It is assumed that all transistors included in the second standard cell 10 are unfolded transistors. The second standard cell 10 includes M1 pins A, B, C, and D; M2 pins 21, 25, 31, and 35; and the vias V1, V2, V3, and V4.

The M1 pins A, B, C, and D, placed in a first direction (e.g., a Y-direction) successively side by side, are pins placed at the first metal layer M1. The M2 pins 21, 25, 31, and 35 placed in a second direction (e.g., an X-direction) are pins placed at the second metal layer M2. The first direction and the second direction are perpendicular to each other. The first direction or the Y-direction and the second direction or the X-direction illustrated in FIGS. 5 through 8 are illustrated to distinguish the placement directions of the pins A through D and 21, 25, 31, and 35.

The first via V1 is vertically connected between a first pin A and a fifth pin 21. The second via V2 is vertically connected between a third pin C and a sixth pin 25. The third via V3 is vertically connected between a second pin B and a seventh pin 31. The fourth via V4 is vertically connected between a fourth pin D and a eighth pin 35.

A via center-to-via center space DV1 between the first via V1 and the second via V2 is greater than the double of the minimum metal center-to-metal center pitch DM between the first pin A and the second pin B. Accordingly, operation S10 illustrated in FIG. 3 is satisfied. Since all transistors included in the second standard cell 10 are unfolded transistors, the IC design system 150 may determine that operation S20 illustrated in FIG. 3 is satisfied.

However, a tip-to-tip space T2T1 defined by a distance between the fifth pin 21 and the sixth pin 25 placed at a first track TRACK1 is less than a DRC space, i.e., a minimum spacing distance for DRC clean defined in design rules. The DRC space may be determined depending on a process. In other words, when the routing congestion is not expected in a standard cell to be placed and routed (i.e., in case of NO) in operation S30, the IC design system 150 may place and route the second standard cell 10 as the standard cell in the IC 1000A.

The via center-to-via center space DV1 between the third via V3 and the fourth via V4 is greater than the double of the minimum metal center-to-metal center pitch DM between the first pin A and the second pin B. The tip-to-tip space T2T1 defined by a distance between the seventh pin 31 and the eighth pin 35 placed at a second track TRACK2 is less than the DRC space.

A reference character MW denotes the width of each of the M1 pins A, B, C, and D. A first overlap width OVL_W1a is an overlap width between the first pin A and the fifth pin 21. A second overlap width OVL_W2a is the overlap width between the third pin C and the sixth pin 25. A first via width VIA_W1a is the width of the first via V1 and a second via width VIA_W2a is the width of the second via V2. The overlap widths OVL_W1a and OVL_W2a indicate minimum widths or areas which can secure the formation of the vias V1 and V2, respectively.

The M1 pins A, B, C, and D have the same width MW. The first overlap width OVL_W1a is the same as the second overlap width OVL_W2a. The vias V1 through V4 have the same width. Here, being the same means physically being the same and being the same in error range allowed during semiconductor manufacturing processes as well.

The IC design system 150 may calculate the via center-to-via center distance DV1 using Equation 1:

$$DV1 = \tfrac{1}{2} VIA\_W1a + OVL\_W1a + T2T1 + OVL\_W2a + \tfrac{1}{2} VIA\_W2a. \quad (1)$$

When the vias V1 and V2 have the same width and the first overlap width OVL_W1a is the same as the second overlap width OVL_W2a, Equation 1 may be rewritten as Equation 2:

$$DV1 = \tfrac{1}{2} VIA\_W1a * 2 + OVL\_W1a * 2 + T2T1. \quad (2)$$

The minimum metal center-to-metal center pitch DM in the second standard cell 10 is equal to or less than 80 nm, i.e., DM≤80 nm. A ratio of the first overlap width OVL_W1a to the width MW of the first pin A, i.e., OVL_W1a/MW may be equal to or greater than 0.8.

Figure 6:
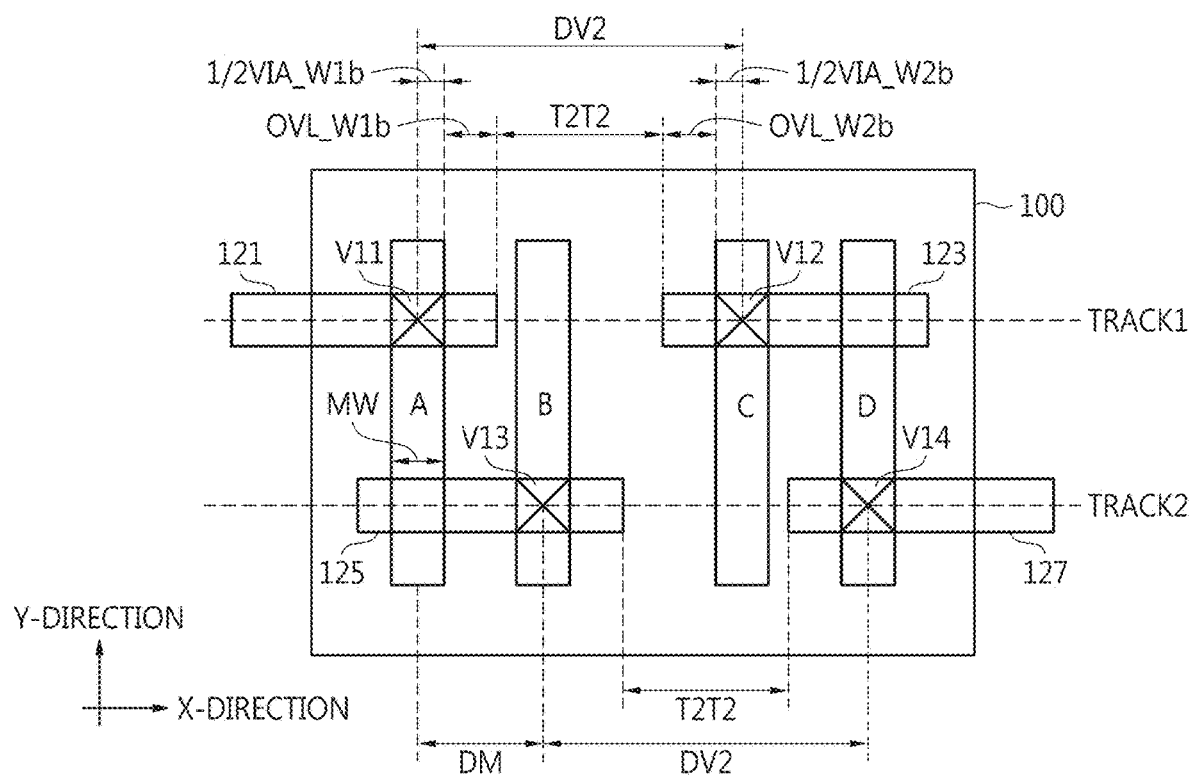
FIG. 6 is a conceptual diagram of the layout of a first standard cell from which routing interference between internal pins has been removed according to the conditions illustrated in FIG. 3.

FIG. 6 is a conceptual diagram of the layout of the first standard cell 100 from which routing interference between internal pins has been removed according to the conditions illustrated in FIG. 3.

Referring to FIG. 6, when the routing congestion is expected (i.e., in case of YES) in operation S30, the first standard cell 100 may be placed and routed. Referring to FIGS. 1 through 4 and FIG. 6, it is assumed that all transistors included in the first standard cell 100 are unfolded transistors. The first standard cell 100 includes the M1 pins A, B, C, and D; M2 pins 121, 123, 125, and 127; and the vias V11, V12, V13, and V14.

The M1 pins A, B, C, and D, placed in the first direction successively side by side, are pins placed at the first metal layer M1. The M2 pins 121, 123, 125, and 127 placed in the second direction are pins placed at the second metal layer M2.

The first via V11 is vertically connected between the first pin A and the fifth pin 121. The second via V12 is vertically connected between the third pin C and the sixth pin 123. The third via V13 is vertically connected between the second pin A and the seventh pin 125. The fourth via V14 is vertically connected between the fourth pin D and the eighth pin 127.

A via center-to-via center space DV2 between the first via V11 and the second via V12 is greater than the double of the minimum metal center-to-metal center pitch DM between the first pin A and the second pin B. Accordingly, the IC design system 150 may determine that operation S10 illustrated in FIG. 3 is satisfied. Since all transistors included in the first standard cell 100 are unfolded transistors, the IC design system 150 may determine that operation S20 illustrated in FIG. 3 is satisfied.

A tip-to-tip space T2T2 defined by a distance between the fifth pin 121 and the sixth pin 123 placed at the first track TRACK1 is equal to or greater than the DRC space, i.e., the minimum spacing distance for DRC clean defined in design rules. In other words, when the routing congestion is expected in a standard cell to be placed and routed (i.e., in case of YES) in operation S30, the IC design system 150 may place and route the first standard cell 100 as the standard cell in the IC 1000A.

The via center-to-via center space DV2 between the third via V13 and the fourth via V14 is greater than the double of the minimum metal center-to-metal center pitch DM between the first pin A and the second pin B. The tip-to-tip space T2T2 defined by a distance between the seventh pin 125 and the eighth pin 127 placed at a second track TRACK2 is equal to or greater than the DRC space.

The reference character MW denotes the width of each of the M1 pins A, B, C, and D. A first overlap width OVL_W1$b$ is the overlap width between the first pin A and the fifth pin 121. A second overlap width OVL_W2$b$ is the overlap width between the third pin C and the sixth pin 123. A first via width VIA_W1$b$ is the width of the first via V11 and a second via width VIA_W2$b$ is the width of the second via V12. The M1 pins A, B, C, and D have the same width MW. The first overlap width OVL_W1$b$ is the same as the second overlap width OVL_W2$b$. The vias V11 through V14 have the same width.

The IC design system 150 may calculate the via center-to-via center distance DV2 using Equation 3:

$$DV2 = \frac{1}{2} VIA\_W1b*2 + OVL\_W1b*2 + T2T2. \quad (3)$$

The minimum metal center-to-metal center pitch DM in the first standard cell 100 is equal to or less than 80 nm. A ratio of the first overlap width OVL_W1$b$ to the width MW of the first pin A, i.e., OVL_W1$b$/MW may be equal to or greater than 0.8.

As shown in FIG. 5, routing interference exists between the first and second pins A and B, between the first and third pins A and C, between the fourth and third pins D and C, and between the fourth and second pins D and B in the second standard cell 10. In other words, the first overlap width OVL_W1$b$ may influence the routing of the third pin C as well as the second pin B.

A distance between the first and third pins A and C in the first standard cell 100 illustrated in FIG. 6 is greater than a distance between the first and third pins A and C in the second standard cell 10 illustrated in FIG. 5. In other words, the tip-to-tip space T2T2 is greater than the tip-to-tip space T2T1, and therefore, the via center-to-via center space DV2 is greater than the via center-to-via center space DV1.

When the distance between the first and third pins A and C increases in the first standard cell 100 illustrated in FIG. 6, routing interference exists between the first and second pins A and B but does not exist between the first and third pins A and C. In addition, routing interference exists between the fourth and third pins D and C but does not exist between the fourth and second pins D and B. In other words, when the IC design system 150 places and routes the pins A through D in the first standard cell 100 as shown in FIG. 6, routing interference between the first and third pins A and C and between the fourth and second pins D and B is eliminated.

Figure 7:
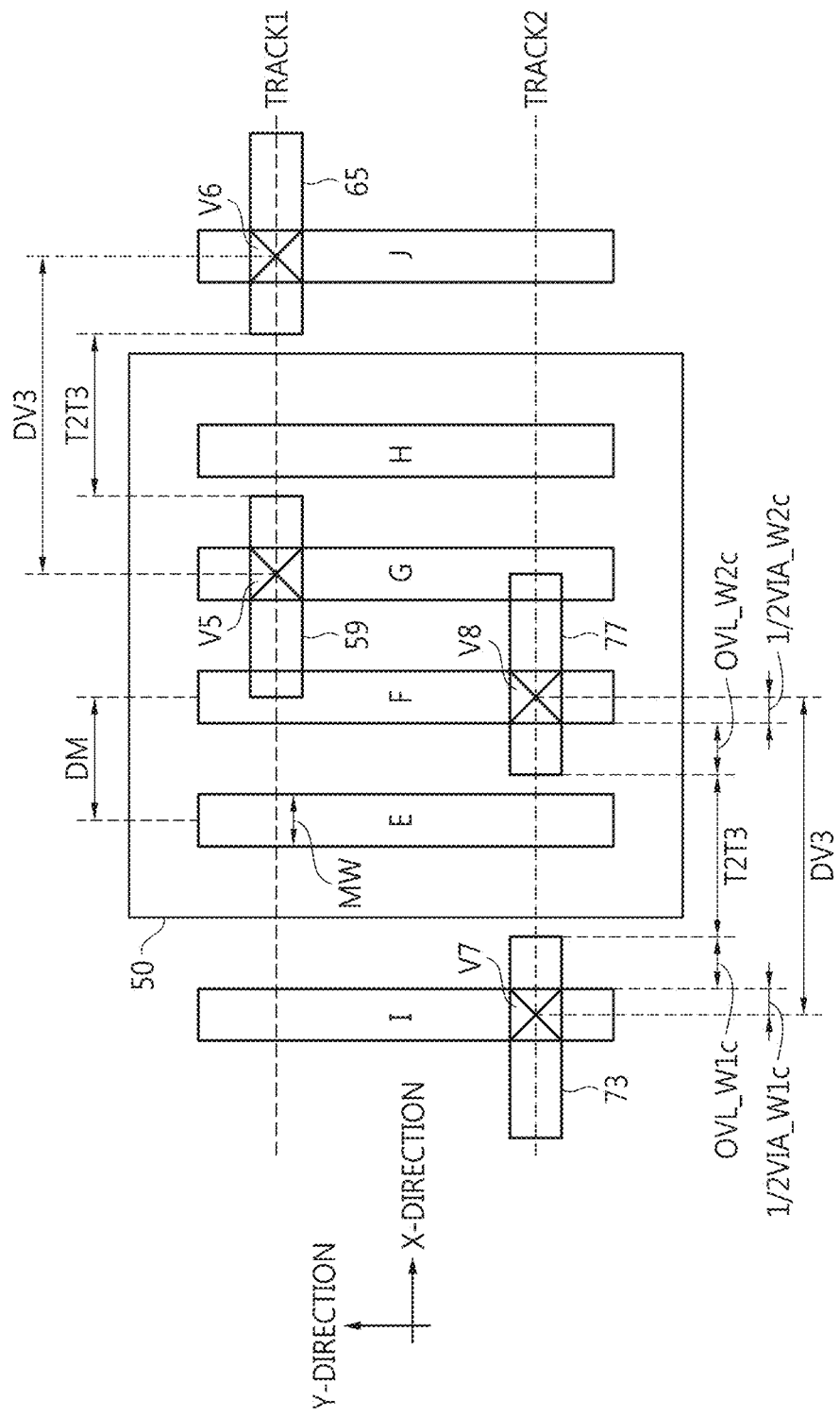
FIG. 7 is a conceptual diagram of the layout of a second standard cell from which routing interference between internal pins and external pins is not removed according to the conditions illustrated in FIG. 3.

FIG. 7 is a conceptual diagram of the layout of the second standard cell 50 from which routing interference between internal pins and external pins is not removed according to the conditions illustrated in FIG. 3.

Referring to FIGS. 1 through 4 and FIG. 7, M1 pins E, F, G, and H, M2 pins 59 and 77, and vias V5 and V8 are placed and routed inside the second standard cell 50; and M1 pins I and J, M2 pins 65 and 73, and vias V6 and V7 are placed and routed outside the second standard cell 50.

When the routing congestion is not expected (i.e., in case of NO in operation S30), the IC design system 150 may place and route the second standard cell 50. It is assumed that all transistors included in the second standard cell 50 are unfolded transistors.

The M1 pins I, E, F, G, H, and J, placed in the first direction (e.g., the Y-direction) successively side by side, are pins placed at the first metal layer M1. The M2 pins 59, 65, 73, and 77 placed in the second direction (e.g., the X-direction) are pins placed at the second metal layer M2.

The first via V7 is vertically connected between the first pin I and the ninth pin 73. The second via V8 is vertically connected between the third pin F and the tenth pin 77. The third via V5 is vertically connected between the fourth pin G and the seventh pin 59. The fourth via V6 is vertically connected between the sixth pin J and the eighth pin 65.

A via center-to-via center space DV3 between the first via V7 and the second via V8 is greater than the double of the minimum metal center-to-metal center pitch DM between the second pin E and the third pin F. Accordingly, the IC design system 150 may determine that operation S10 illustrated in FIG. 3 is satisfied. Since all transistors included in the second standard cell 50 are unfolded transistors, the IC design system 150 may determine that operation S20 illustrated in FIG. 3 is satisfied.

A tip-to-tip space T2T3 defined by a distance between the ninth pin 73 and the tenth pin 77 placed at the second track TRACK2 is less than the DRC space, i.e., the minimum spacing distance for DRC clean defined in design rules. In other words, when the routing congestion is not expected in a standard cell to be placed and routed (i.e., in case of NO in operation S30), the IC design system 150 may place and route the second standard cell 50 as the standard cell in the IC 1000A.

The via center-to-via center space DV3 between the third via V5 and the fourth via V6 is greater than the double of the minimum metal center-to-metal center pitch DM between the second pin E and the third pin F. The tip-to-tip space T2T3 defined by a distance between the seventh pin 59 and the eighth pin 65 placed at the first track TRACK1 is less than the DRC space.

The reference character MW denotes the width of each of the M1 pins I, E, F, G, H, and J. A first overlap width OVL_W1c is the overlap width between the first pin I and the ninth pin 73. A second overlap width OVL_W2c is the overlap width between the third pin F and the tenth pin 77. A first via width VIA_W1c is the width of the first via V7 and a second via width VIA_W2c is the width of the second via V8.

The M1 pins I, E, F, G, H, and J have the same width MW. The first overlap width OVL_W1c is the same as the second overlap width OVL_W2c. The vias V5 through V8 have the same width.

The IC design system 150 may calculate the via center-to-via center distance DV3 using Equation 4:

$$DV3 = \frac{1}{2} VIA\_W1c*2 + OVL\_W1c*2 + T2T3. \quad (4)$$

The minimum metal center-to-metal center pitch DM in the first standard cell 100 is equal to or less than 80 nm. A ratio of the first overlap width OVL_W1c to the width MW of the first pin I, i.e., OVL_W1c/MW may be equal to or greater than 0.8.

Figure 8:
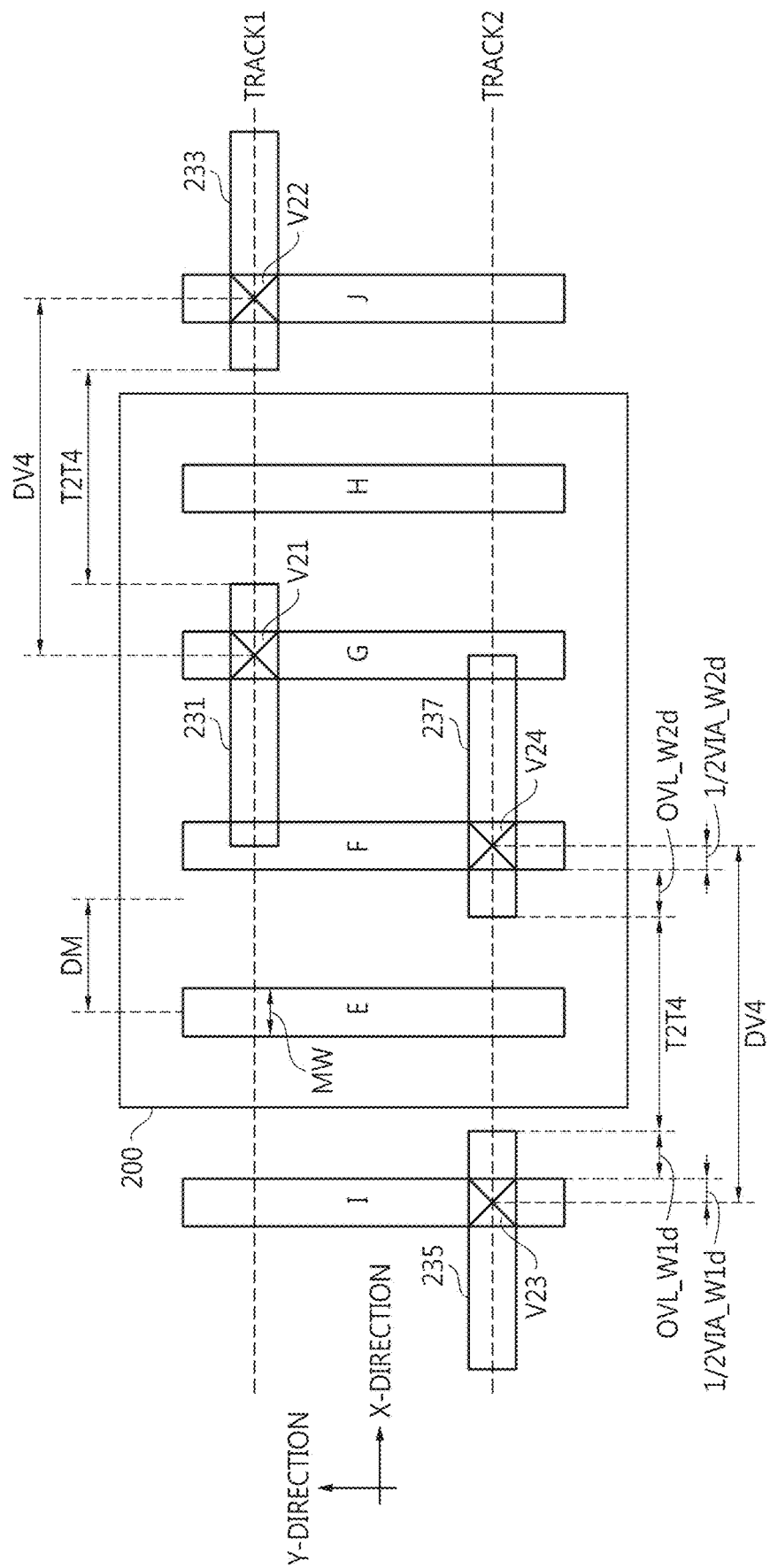
FIG. 8 is a conceptual diagram of the layout of a first standard cell from which routing interference between internal pins and external pins has been removed according to the conditions illustrated in FIG. 3.

FIG. 8 is a conceptual diagram of the layout of the first standard cell 200 from which routing interference between internal pins and external pins has been removed according to the conditions illustrated in FIG. 3.

Referring to FIGS. 1 through 4 and FIG. 8, the M1 pins E, F, G, and H, M2 pins 231 and 237, and vias V21 and V24 are placed and routed inside the first standard cell 200; and the M1 pins I and J, M2 pins 233 and 235, and vias V23 and V22 are placed and routed outside the first standard cell 200.

When the routing congestion is expected (i.e., in case of YES in operation S30), the IC design system 150 may place and route the first standard cell 200. It is assumed that all transistors included in the first standard cell 200 are unfolded transistors.

The M1 pins I, E, F, G, H, and J, placed in the first direction (e.g., the Y-direction) successively side by side, are pins placed at the first metal layer M1. The M2 pins 231, 233, 235, and 237 placed in the second direction (e.g., the X-direction) are pins placed at the second metal layer M2.

The first via V23 is vertically connected between the first pin I and the ninth pin 235. The second via V24 is vertically connected between the third pin F and the tenth pin 237. The third via V21 is vertically connected between the fourth pin G and the seventh pin 231. The fourth via V22 is vertically connected between the sixth pin J and the eighth pin 233.

A via center-to-via center space DV4 between the first via V23 and the second via V24 is greater than the double of the minimum metal center-to-metal center pitch DM between the second pin E and the third pin F. Accordingly, the IC design system 150 may determine that operation S10 illustrated in FIG. 3 is satisfied. Since all transistors included in the first standard cell 200 are unfolded transistors, the IC design system 150 may determine that operation S20 illustrated in FIG. 3 is satisfied.

A tip-to-tip space T2T4 defined by a distance between the ninth pin 235 and the tenth pin 237 placed at the second track TRACK2 is equal to or greater than the DRC space, i.e., the minimum spacing distance for DRC clean defined in design rules. In other words, when the routing congestion is expected in a standard cell to be placed and routed (i.e., in case of YES) in operation S30, the IC design system 150 may place and route the first standard cell 200 as the standard cell in the IC 1000A.

The via center-to-via center space DV4 between the third via V21 and the fourth via V22 is greater than the double of the minimum metal center-to-metal center pitch DM between the second pin E and the third pin F. The tip-to-tip space T2T4 defined by a distance between the seventh pin 231 and the eighth pin 233 placed at the first track TRACK1 is equal to or greater than the DRC space.

The reference character MW denotes the width of each of the M1 pins I, E, F, G, H, and J. A first overlap width OVL_W1d is the overlap width between the first pin I and the ninth pin 235. A second overlap width OVL_W2d is the overlap width between the third pin F and the tenth pin 237. A first via width VIA_W1d is the width of the first via V23 and a second via width VIA_W2d is the width of the second via V24.

The M1 pins I, E, F, G, H, and J have the same width MW. The first overlap width OVL_W1d is the same as the second overlap width OVL_W2d. The vias V21 through V24 have the same width.

the IC design system 150 may determine the via center-to-via center distance DV4 may be calculated using Equation 5:

$$DV4 = \frac{1}{2} VIA\_W1d*2 + OVL\_W1d*2 + T2T4. \quad (5)$$

The minimum metal center-to-metal center pitch DM in the first standard cell 200 is equal to or less than 80 nm. A ratio of the first overlap width OVL_W1d to the width MW of the first pin I, i.e., OVL_W1d/MW may be equal to or greater than 0.8.

Referring to FIGS. 5 through 8, the via widths VIA_W1a, VIA_W1b, VIA_W1c, and VIA_W1d may be the same as one another; the via widths VIA_W2a, VIA_W2b, VIA_W2c, and VIA_W2d may be the same as one another; the overlap widths OVL_W1a, OVL_W1b, OVL_W1c, and OVL_W1d may be the same as one another; and the overlap widths OVL_W2a, OVL_W2b, OVL_W2c, and OVL_W2d may be the same as one another.

As shown in FIG. 7, routing interference exists between the first and second pins I and E, between the first and third pins I and F, between the sixth and fifth pins J and H, and between the sixth and fourth pins J and G in the second standard cell 50. In other words, the first overlap width OVL_W1d may influence the routing of the third pin F as well as the second pin E.

The distance between the first and third pins I and F in the first standard cell 200 illustrated in FIG. 8 is greater than the distance between the first and third pins I and F in the second standard cell 50 illustrated in FIG. 7. In other words, the tip-to-tip space T2T4 is greater than the tip-to-tip space T2T3, and therefore, the via center-to-via center distance DV4 is greater than the via center-to-via center distance DV3.

When the distance between the first and third pins I and F increases in the first standard cell 200 illustrated in FIG. 8, the routing interference still exists between the first and second pins I and E but does not exist between the first and third pins I and F. In addition, when the distance between the sixth and fourth pins J and G increases in the first standard cell 200 illustrated in FIG. 8, the routing interference still exists between the sixth and fifth pins J and H but does not exist between the sixth and fourth pins J and G. In other words, when the pins I through J are placed and routed in the first standard cell 200 as shown in FIG. 8, the routing interference between the first and third pins I and F and between the sixth and fourth pins J and G is eliminated.

When the third pin F and the fourth pin G are placed and routed taking into account the distance between the pins I and J placed and routed outside the first standard cell 200 and the pins E, F, G, and H placed and routed inside the first standard cell 200, as shown in FIG. 8, the routing interference between the first and third pins I and F and between the sixth and fourth pins J and G is eliminated. The layout area of the first standard cell 200 illustrated in FIG. 8 is greater than the layout area of the second standard cell 50 illustrated in FIG. 7, but routing efficiency increases when the first standard cell 200 is placed.

Figure 9:
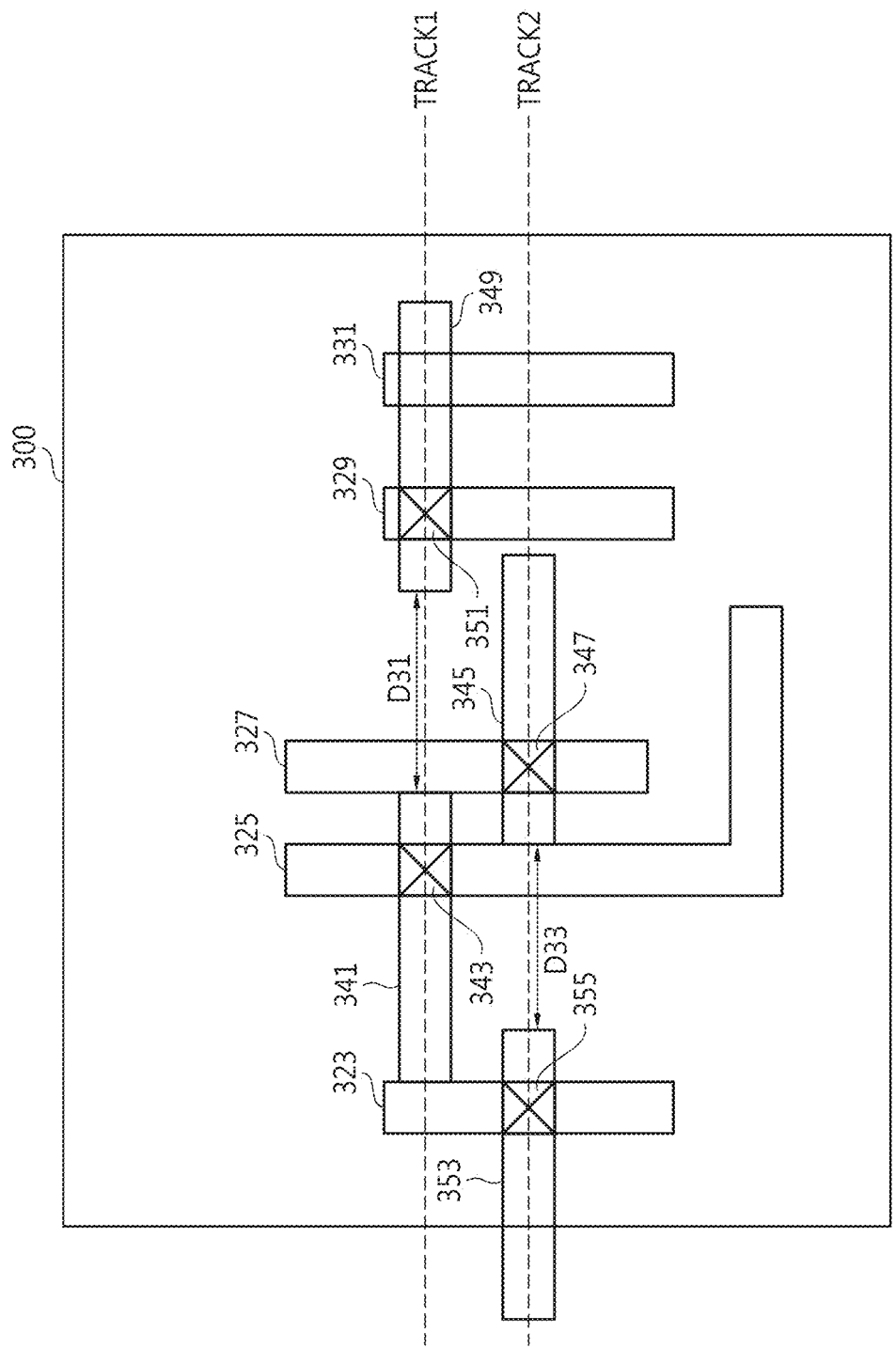
FIG. 9 is a diagram of the layout of an AND-OR-inverter (AOI)22 cell corresponding to a first standard cell from which routing interference between internal pins has been removed.

FIG. 9 is a diagram of the layout of an AOI22 cell corresponding to a first standard cell from which routing interference between internal pins has been removed.

Referring to FIGS. 1 through 4 and FIGS. 6 and 9, the first standard cell 300 integrated into the IC 1000A illustrated in FIG. 4 may be implemented as an AOI22 gate circuit. The AOI22 gate circuit 300 illustrated in FIG. 9 has a layout for eliminating or reducing routing interference among internal cell pins 323, 325, 327, and 329, which have been described with reference to FIG. 6.

The AOI22 gate circuit 300 includes five M1 pins 323, 325, 327, 329, and 331 and four M2 pins 341, 345, 349, and 353. The M2 pins 341 and 349 are placed along the first M2 track TRACK1 and the M2 pins 345 and 353 are placed along the second M2 track TRACK2. A first via 343 is used to vertically connect the second pin 325 with the sixth pin 341, a second via 351 is used to vertically connect the fourth pin 329 with the seventh pin 349, a third via 355 is used to vertically connect the first pin 323 with the eighth pin 353, and a fourth via 347 is used to vertically connect the third pin 327 with the ninth pin 345.

When the distance between the first pin 323 and the third pin 327 increases, a tip-to-tip space D33 between the eighth pin 353 and the ninth pin 345 is greater than the DRC space. When the distance between the second pin 325 and the fourth pin 329 increases, a tip-to-tip space D31 between the sixth pin 341 and the seventh pin 349 is greater than the DRC space. In other words, when the distance between the pins 323 and 327 coming at first and third places starting from the first pin 323 among at least three pins 323, 325, 327, 329, and 331 placed successively side by side increases; routing interference between the pins 323 and 327 at the first and third places is eliminated. In addition, when the distance between the pins 325 and 329 coming at first and third places starting from the second pin 325 among at least three pins 323, 325, 327, 329, and 331 placed successively side by side increases; routing interference between the pins 325 and 329 at the first and third places is eliminated.

The technical ideas about the placement and routing of the first standard cell 100 described with reference to FIG. 6 are applied to the placement and routing of the first standard cell 300 illustrated in FIG. 9.

Figure 10:
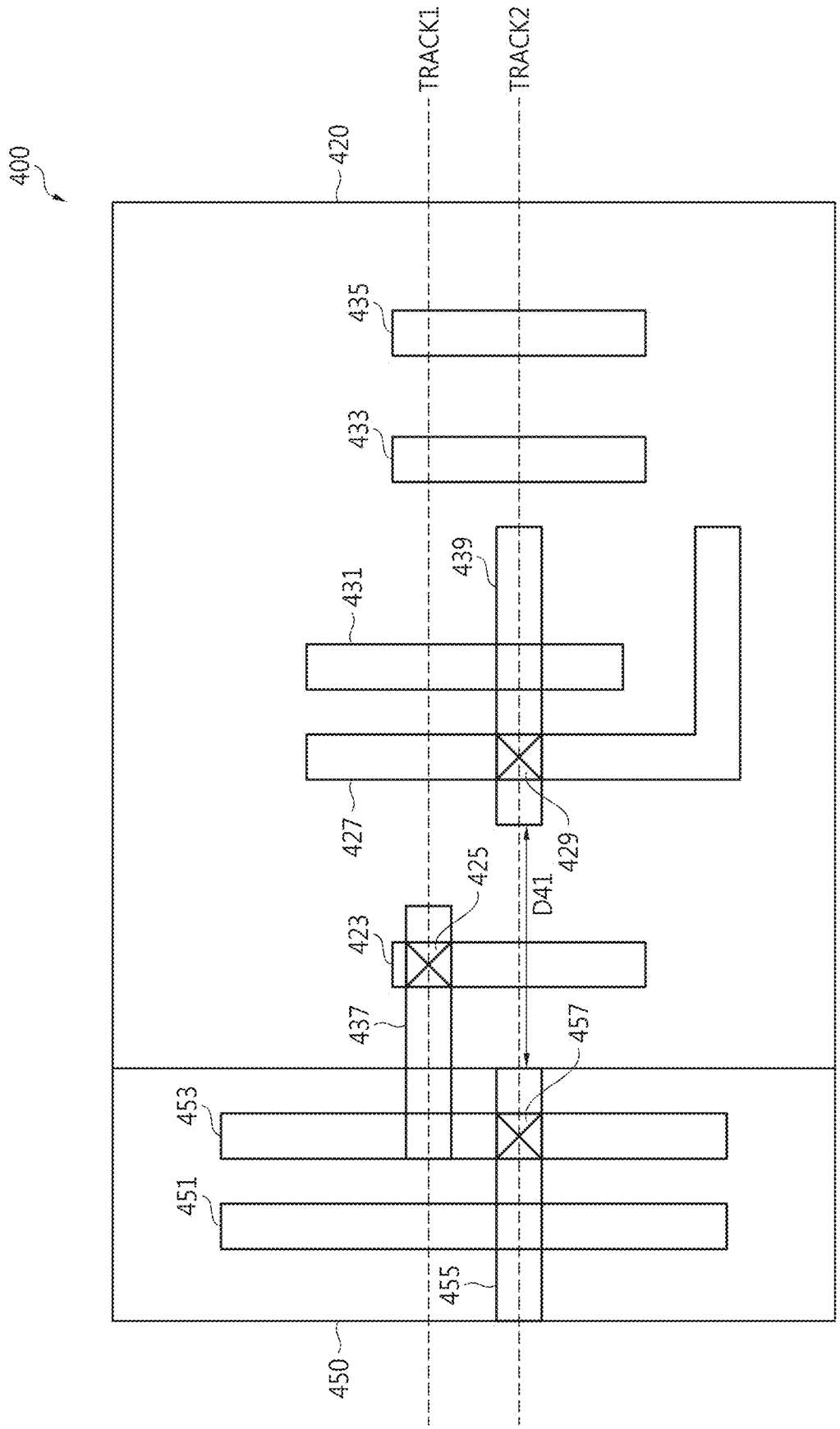
FIG. 10 is a diagram of the layout of an AOI22 cell corresponding to a first standard cell from which routing interference between internal pins and external pins has been removed.

FIG. 10 is a diagram of the layout of an AOI22 cell corresponding to a first standard cell from which routing interference between internal pins and external pins has been removed.

Referring to FIG. 10, an electronic circuit 400 including an AOI22 gate circuit 420 and an inverter 450 may be integrated into the IC 1000A illustrated in FIG. 4. The AOI22 gate circuit 420 may refer to the first standard cell 420. The electronic circuit 400 has a layout for eliminating or reducing routing interference among internal pins 423, 427, 431, 433, and 435 inside the first standard cell 420 and external pins 451 and 453 outside the first standard cell 420.

The AOI22 gate circuit 420 includes five M1 pins 423, 427, 431, 433, and 435 and two M2 pins 437 and 439. The M2 pin 437 is placed along the first M2 track TRACK1 and the M2 pin 439 is placed along the second M2 track TRACK2. The inverter 450 includes the M1 pins 451 and 453, an M2 pin 455, and a via 457. The M2 pin 455 is placed along the second M2 track TRACK2 and the via 457 is used to vertically connect the M1 pin 453 with the M2 pin 455.

When the distance between the first pin 453 and the third pin 427 increases, a tip-to-tip space D41 between the M2 pins 439 and 455 is greater than the DRC space. In other words, when the distance between the pins 453 and 427 coming at first and third places starting from the first pin 453 among at least three pins 453, 423, 427, 431, 433, and 435 placed successively side by side increases; routing interference between the pins 453 and 427 at the first and third places is eliminated.

The technical ideas about the placement and routing of the first standard cell 200 described with reference to FIG. 8 are applied to the placement and routing of the first standard cell 420 illustrated in FIG. 10.

FIG. 11 is a block diagram of the design system 150 which designs an IC including a first standard cell and a second standard cell according to some example embodiments of the inventive concepts.

Referring to FIGS. 1 through 11, the IC design system 150 may include a memory device 170 and a placement and routing tool 190.

The memory device 170 may include a non-transitory computer readable medium. Examples of non-transitory computer-readable media include magnetic media such as hard disks, floppy disks, and magnetic tape; optical media such as CD ROM discs and DVDs; magneto-optical media such as optical discs; and hardware devices that are specially configured to store and perform program instructions, such as read-only memory (ROM), random access memory (RAM), flash memory, and the like. The non-transitory computer-readable media may also be a distributed network, so that the program instructions are stored and executed in a distributed fashion.

The memory device 170 may store a design file 171, a first cell library 173, and a second cell library 177. The design file 171 may include information for a netlist and information for a standard cell layout.

The first cell library 173 may store netlist information for the library of the first standard cells 100 and 200 which have been changed to eliminate routing interference between adjacent pins as described with reference to FIGS. 6 and 8. The first cell library 173 may store information indicating one or more cell layouts 175 of each of the first standard cells 100 and 200 stored therein. The cell layouts 175 may store information indicating the position, size, orientation, and input/output (I/O) nets of each of the cell layouts 175. The first cell library 173 may be referred to as a routing friendly library.

The second cell library 177 may store netlist information for the library of the original second standard cells 10 and 50 which have been described with reference to FIGS. 5 and 7. The second cell library 177 may store information indicating one or more cell layouts 179 of each of the second standard cells 10 and 50 stored therein. The cell layouts 179 may store information indicating the position, size, orientation, and I/O nets of each of the cell layouts 177. The second cell library 177 may be referred to as an original standard cell library.

The placement and routing tool 190 may include a central processing unit (CPU) or processor 191 and optionally a memory.

The CPU 191 may include at least one processor implemented by at least one semiconductor chip disposed on a printed circuit board. The processor may be an arithmetic logic unit, a digital signal processor, a microcomputer, a field programmable array, a programmable logic unit, a microprocessor or any other device capable of responding to and executing instructions in a defined manner.

The memory may contain computer readable code that, when executed by the processor, configures the CPU 191 as a special purpose computer. For example, when executed, the code may configure the CPU 191 to configure layouts of standard cells such as a first standard cell and a second standard cell, and to route connections between the layouts based on an input netlist.

To perform placement and routing, the placement and routing tool 190 may use the layouts of standard cell such as a first standard cell and a second standard cell determined by a determination logic 193. In some example embodiments, the memory may include code that, when executed configures the CPU 191 to perform the functions of the determination logic 193, such that the determination logic 193 may be implemented as a software component executed by a central processing unit (CPU) 191. In other example embodiments, the determination logic 193 may be a hardware component such as a determination logic circuit.

According to some example embodiments of the inventive concepts, before the placement and routing is performed, the determination logic 193 may estimate a region in which routing congestion will occur and a region in which routing congestion will not occur and determine which of the cell layouts 175 in the first cell library 173 and the cell layouts 179 in the second cell library 177 will be subjected to the placement and routing according to the estimation result. Here, the region may refer to a region in which the first standard cell 100, 200, 300, or 400 and/or the second standard cell 10 or 50 will be placed and routed.

According to some embodiments of the inventive concept, the determination logic 193 may use the cell layouts 179 in the second cell library 177 in initial placement and routing and may determine to replace the cell layouts 179 in the second cell library 177 with the cell layouts 175 in the first cell library 173 for a region having routing congestion.

Figure 12:
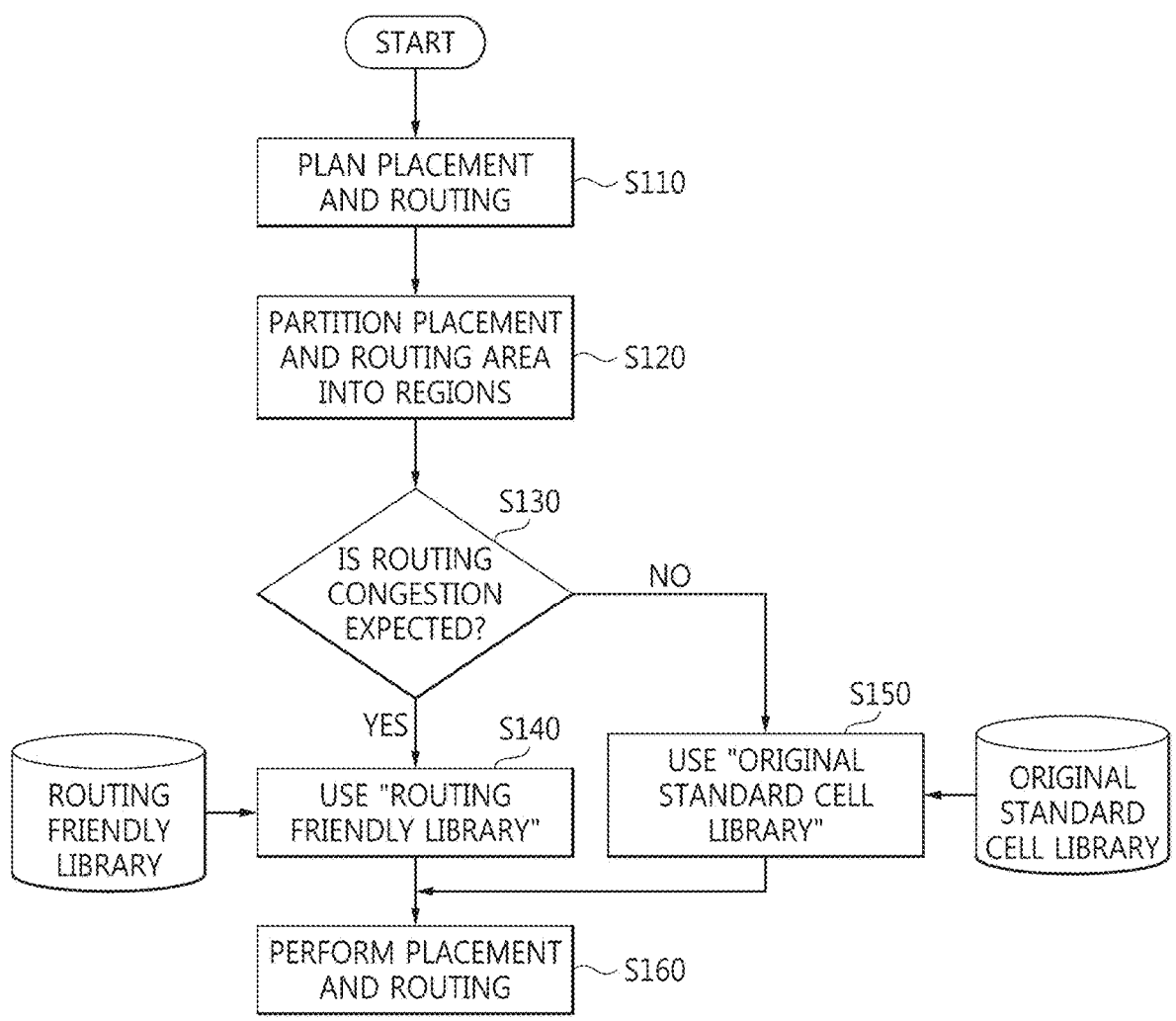
FIG. 12 is a flowchart of a method of laying out a first standard cell and a second standard cell according to some example embodiments of the inventive concepts.

FIG. 12 is a flowchart of a method of laying out a first standard cell and a second standard cell according to some example embodiments of the inventive concepts.

Referring to FIGS. 11 and 12, in operation S110, the placement and routing tool 190 may plan placement and routing.

In operation S120, the placement and routing tool 190 may partition a placement and routing area into a plurality of regions.

In operation S130, the placement and routing tool 190, and more particularly, the determination logic 193 may determine whether each of the regions is expected to have routing congestion or not. Routing congestion may be determined based on the number of DRC violations.

For example, the determination logic 193 may count the number of DRC violations occurring in a target region (i.e., a partitioned region) and compare a count value with a reference value. When the count value is equal to or greater than the reference value, the determination logic 193 may determine that the target region is expected to have routing congestion. When the count value is less than the reference value, the determination logic 193 may determine that the target region is not expected to have routing congestion. Referring to FIGS. 5 and 7, the DRC violation count value for each track in the standard cell 10 or 50 may be 2, but example embodiments of the inventive concepts are not restricted to these example embodiments. The count value of 2 is just an example. The reference value may be determined by a designer of the IC 1000A.

In operations S140 and S160, the placement and routing tool 190 may perform placement and routing on the region expected to have routing congestion using the cell layouts 175 in the first cell library 173. For instance, a first standard cell may be placed and routed in the region expected to have routing congestion. Examples of the first standard cell may be the standard cells 100, 200, 300, and 420 described with reference to FIGS. 6, 8, 9, and 10.

In operations S150 and S160, the placement and routing tool 190 may perform placement and routing on the region which is expected to not have routing congestion (i.e., the region having the count value less than the reference value) using the cell layouts 179 in the second cell library 177. For instance, a second standard cell may be placed and routed in the region expected to not have routing congestion. Examples of the second standard cell may be the standard cells 10 and 50 described with reference to FIGS. 5 and 7.

Although the first standard cell 100, 200, 300, or 420 and the second standard cell 10 or 50 are illustrated in FIG. 4, at least one peripheral pin connected to the standard cell 50, 200, or 420 may be placed and routed in the IC 1000A as shown in FIGS. 7, 8, and 10. For instance, the first standard cell 420 may be placed and routed together with the inverter 450 in the IC 1000A, as shown in FIG. 10.

Figure 13:
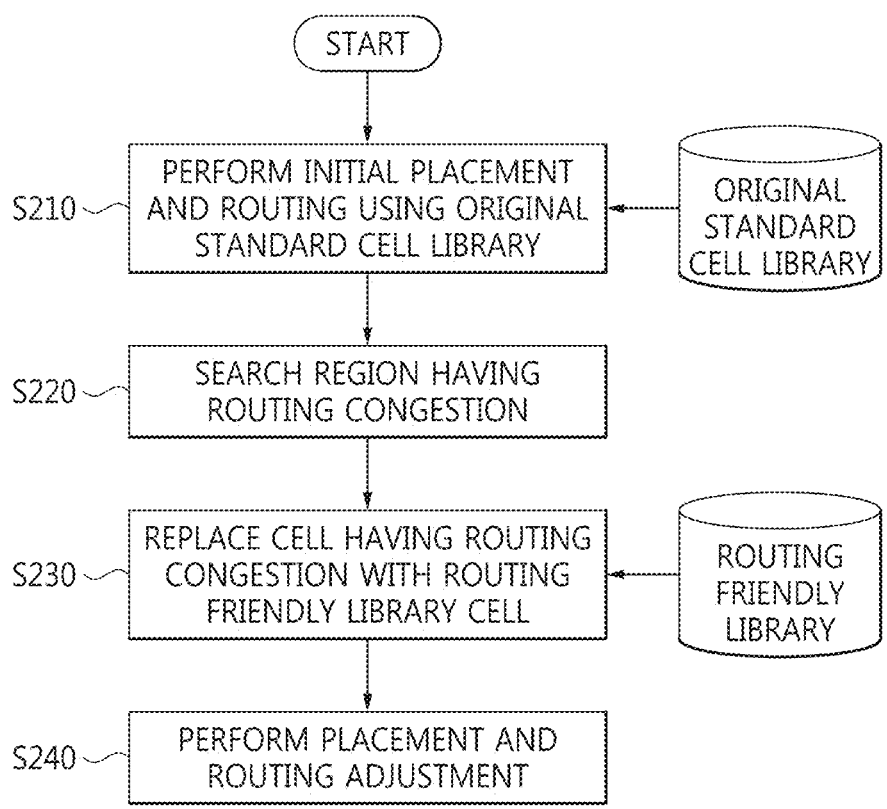
FIG. 13 is a flowchart of a method of laying out a first standard cell and a second standard cell according to other example embodiments of the inventive concepts.

FIG. 13 is a flowchart of a method of laying out a first standard cell and a second standard cell according to other example embodiments of the inventive concepts.

Referring to FIGS. 11 and 13, in operation S210, the placement and routing tool 190 may perform initial placement and routing using the cell layouts 179 in the second cell library 177.

In operation S220, the placement and routing tool 190 may search for or determine regions having routing congestion among region subjected to the placement and routing.

Operation S220 of FIG. 13 may be performed in a similar manner to operation S130 of FIG. 12. For instance, the placement and routing tool 190, and more particularly, the determination logic 193 may count the number of DRC violations in each of the region subjected to the placement and routing, compare a count value corresponding to the number of DRC violations with a reference value, and determine the region for which the count value is equal to or greater than the reference value as having routing congestion.

In operation S230, when regions having routing congestion are searched, the placement and routing tool 190 may replace (or substitute) cell layouts that have been placed and routed in the regions with the cell layouts 175 in the first cell library 173. Since the replaced standard cell (or the layout of a first standard cell) may be larger than an original standard cell (or the layout of a second standard cell), a DRC violation may occur when the standard cell is replaced only causing an overlapping between the replaced standard cell and an adjacent standard cell.

Therefore, in operation S240, the placement and routing tool 190 performs placement on the adjacent standard cell after performing the replacement. In other words, the placement and routing tool 190 may perform placement and routing adjustment by removing the overlap area between the standard cells and newly perform routing to eliminate the DRC violation.

As described above with reference to FIGS. 11 through 13, the placement and routing tool 190 may estimate the shape or structure of vias and/or M2 pins which are connected to M1 pins and may restructure a standard cell layout and replace the M1 pins and the M2 pins according to the estimation result. Accordingly, the placement and routing tool 190 minimizes routing interference between the M1 pins and the M2 pins, so that routing efficiency is increased while a block level area is decreased. The block level area may be an area occupied by standard cells in the entire area of an IC.

In a process of constructing a standard cell layout reducing routing interference between adjacent pins, the area of the standard cell layout may increase. However, even though having routing interference between adjacent pins, the placement and routing tool 190 may place a standard cell, which has a small layout area, at a region having low routing congestion and place a standard cell, which is advantageous to routing even through having a large layout area, at a region having high routing congestion. Through such operation, the overall block level area is decreased.

The placement and routing tool 190 may reduce (or, alternatively, overcome) the difficulties or problems which may occur during placement and routing due to the miniaturization or shrinkage of manufacturing processes. A standard cell (i.e., the first standard cell and/or the second standard cell) or a standard cell layout (i.e., a first standard cell layout and/or a second standard cell layout) illustrated in FIGS. 4 through 10 may be formed in an IC. The IC 1000A illustrated in FIG. 4 may be a CPU, a processor, an application processor, or a digital signal processor but is not restricted thereto. The IC 1000A illustrated in FIG. 4 may be used in various electronic devices or systems.

In a method laying out a standard cell using the placement and routing tool 190, a placement and routing area is partitioned into a plurality of areas in operation S120. The placement and routing tool 190 determines whether each partitioned region has routing congestion based on the number of DRC violations in operation S130. In detail, the determination logic 193 may count the number of DRC violations occurring in a target region (i.e., a partitioned region) and compare a count value with a reference value. When the count value is equal to or greater than the reference value, the placement and routing tool 190 may determine that the target region has routing congestion. When the count value is less than the reference value, the placement and routing tool 190 may determine that the target region does not have routing congestion.

The placement and routing tool 190 places and routes a first standard cell in the partitioned region determined as having routing congestion using a cell layout in a first cell library in operations S140 and S160. However, the placement and routing tool 190 places and routes a second standard cell in the partitioned region determined as not having routing congestion using a cell layout in a second cell library in operations S150 and S160.

As shown in FIG. 6, the placement and routing tool 190 places and routes the first standard cell 100 in the IC 1000A. In other words, the placement and routing tool 190 formed only first unfolded transistors in the first standard cell 100; places, successively side by side, the first, second and third metals A, B, and C in the first direction at the first layer M1; places the fourth metal 121 and the fifth metal 123 separated from each other and in the second direction at the second layer M2; connects the first metal A with the fourth metal 121 using the first via V11, and connects the third metal C with the fifth metal 123 using the second via V12. The via center-to-via center space DV2 between the first via V11 and the second via V12 is greater than the double of the minimum metal center-to-metal center pitch DM between the first metal A and the second metal B. The minimum metal center-to-metal center pitch DM is equal to or less than 80 nm. The tip-to-tip space T2T2 between the fourth metal 121 and the fifth metal 123 is equal to or greater than the minimum spacing distance for DRC clean.

As shown in FIG. 5, the placement and routing tool 190 places and routes the second standard cell 10 in the IC 1000A. In other words, the placement and routing tool 190 formed only second unfolded transistors in the second standard cell 10; places, successively side by side, the sixth, seventh and eighth metals A, B, and C in the first direction at the first layer M1; places the ninth metal 21 and the tenth metal 25 separated from each other in the second direction at the second layer M2; connects the sixth metal A with the ninth metal 21 using the third via V1, and connects the eighth metal C with the tenth metal 25 using the fourth via V2. The via center-to-via center space DV1 between the third via V11 and the fourth via V12 is greater than the double of the minimum metal center-to-metal center pitch DM between the sixth metal A and the seventh metal B. The minimum metal center-to-metal center pitch DM is equal to or less than 80 nm. The tip-to-tip space T2T1 between the ninth metal 21 and the tenth metal 25 is less than the minimum spacing distance for DRC clean.

As described above, according to some embodiments of the inventive concept, a standard cell or a standard cell layout increases a space between the first and third pins among at least three pins placed side by side, thereby eliminating routing interference between the first and third pins. Since the standard cell layout eliminates or reduces routing interference between pins among at least three pins placed side by side, the routing efficiency of the standard cell is increased. In a method of laying out a standard cell according to some embodiments of the inventive concept, the standard cell is routed using different standard cell libraries according to whether the standard cell has routing congestion or not, so that an overall block level area is decreased.

While example embodiments of the inventive concepts has been particularly shown and described with reference to some example embodiments thereof, it will be understood by those of ordinary skill in the art that various changes in forms and details may be made therein without departing from the spirit and scope of the example embodiments of the inventive concepts as defined by the following claims.

What is claimed is:
1. An integrated circuit comprising:
a first standard cell associated with a first layer and a second layer of the integrated circuit, the first standard cell including,
   first transistors, the first transistors being first FinFETs (fin field-effect transistors),
   a first metal pin, a second metal pin, and a third metal pin successively side by side on the first layer, the first metal pin, the second metal pin and the third metal pin extending in a first direction, the first metal pin and the second metal pin having a first minimum metal center-to-metal center pitch therebetween, the first minimum metal center-to-metal center pitch being less than or equal to 80 nm,
   a fourth metal pin and a fifth metal pin at the second layer, the fourth metal pin and the fifth metal pin extending in a second direction, the second direction being perpendicular to the first direction,
   a first via between the first metal pin and the fourth metal pin, and a second via between the third metal pin and the fifth metal pin such that a first via center-to-via center space between the first via and the second via is greater than double the first minimum metal center-to-metal center pitch; and a second standard cell associated with the first layer and the second layer of the integrated circuit, the second standard cell including, second transistors, the second transistors being second FinFETs, a sixth metal pin, a seventh metal pin, and an eighth metal pin successively side by side on the first layer, the sixth metal pin, the seventh metal pin, and the eighth metal pin extending in the first direction, the sixth metal pin and the seventh metal pin having a second minimum metal center-to-metal center pitch therebetween, the second minimum metal center-to-metal center pitch being less than or equal to 80 nm, a ninth metal pin and a tenth metal pin on the second layer, the ninth metal pin and the tenth metal pin extending in the second direction, a third via between the sixth metal pin and the ninth metal pin, and a fourth via between the eighth metal pin and the tenth metal pin such that a second via center-to-via center space between the third via and the fourth via is greater than double the second minimum metal center-to-metal center pitch and is greater than the first via center-to-via center space such that the integrated circuit includes vias with different via center-to-via center spaces to reduce routing congestion while the first minimum metal center-to-metal center pitch associated with the first standard cell is equal to the second minimum metal center-to-metal center pitch associated with the second standard cell.

2. The integrated circuit of claim 1, wherein the first via center-to-via center space satisfies $DV2 = VIA\_W1b + 2*OVL\_W1b + T2T2$, where DV2 is the first via center-to-via center space, VIA_W1$b$ is a width of the first via, OVL_W1$b$ is a first overlap width between the first metal pin and the fourth metal pin, and T2T2 is a first tip-to-tip space between the fourth metal pin and the fifth metal pin.

3. The integrated circuit of claim 2, wherein a ratio of the first overlap width to a width of the first metal pin is greater than or equal to 0.8.

4. The integrated circuit of claim 1, wherein the second via center-to-via center space satisfies $DV1 = VIA\_W1a + 2*OVL\_W1a + T2T1$, where DV1 is the second via center-to-via center space, the VIA_W1$a$ is a width of the third via, OVL_W1$a$ is a second overlap width between the sixth metal pin and the ninth metal pin, and T2T1 is a second tip-to-tip space between the ninth metal pin and the tenth metal pin.

5. The integrated circuit of claim 4, wherein one or more of the first standard cell and the second standard cell is a tri-state logic circuit, an XOR gate, an XNOR gate, an AND gate, an OR gate, an inverter, a NAND gate, a NOR gate, a AND-OR-inverter (AOI) gate, or an OR-AND-inverter (OAI) gate.

6. The integrated circuit of claim 1, wherein each of the first FinFETs is manufactured using sub-20 nm fin field effect transistor (FinFET) technology.

7. An integrated circuit comprising:

a first layout area formed using a first standard cell, the first layout area including, first transistors, the first transistors being first FinFETs (fin field-effect transistors), a first metal pin, a second metal pin, and a third metal pin successively side by side on a first layer, the first metal pin, the second metal pin and the third metal pin extending in a first direction, the first metal pin and the second metal pin having a first minimum metal center-to-metal center pitch therebetween, the first minimum metal center-to-metal center pitch being less than or equal to 80 nm, a fourth metal pin and a fifth metal pin on a second layer, the fourth metal pin and the fifth metal pin extending in a second direction, the second direction being perpendicular to the first direction, a first via between the first metal pin and the fourth metal pin, and a second via between the third metal pin and the fifth metal pin; and a second layout area formed using a second standard cell, the second layout area including, second transistors, the second transistors being second FinFETs, a sixth metal pin, a seventh metal pin, and an eighth metal pin successively side by side on the first layer, the sixth metal pin, the seventh metal pin, and the eighth metal pin extending in the first direction, sixth metal pin and the seventh metal pin having a second minimum metal center-to-metal center pitch therebetween, a ninth metal pin and a tenth metal pin on the second layer, the ninth metal pin and the tenth metal pin extending in the second direction, a third via between the sixth metal pin and the ninth metal pin, and a fourth via between the eighth metal pin and the tenth metal pin such that a second via center-to-via center space between the third via and the fourth via is greater than double the second minimum metal center-to-metal center pitch and is greater than the first via center-to-via center space such that the integrated circuit includes vias with different via center-to-via center spaces to reduce routing congestion while the first minimum metal center-to-metal center pitch associated with the first standard cell is equal to the second minimum metal center-to-metal center pitch associated with the second standard cell.

8. The integrated circuit of claim 7, wherein a first via center-to-via center space between the first via and the second via satisfies $DV2 = VIA\_W1b + 2*OVL\_W1b + T2T2$, where DV2 is the first via center-to-via center space, VIA_W1$b$ is a width of the first via, OVL_W1$b$ is a first overlap width between the first metal pin and the fourth metal pin, and T2T2 is a first tip-to-tip space between the fourth metal pin and the fifth metal pin.

9. The integrated circuit of claim 7, wherein the first FinFETs and the first through third metal pins are inside the first standard cell.

10. A placement and routing tool comprising:

a memory configured to store at least a first cell library and a second cell library; and a processor configured to, categorize regions of a routing area as one of congested regions and non-congested regions, place and route a first standard cell in each of the non-congested regions using a cell layout from the first cell library, the first standard cell including first metal pins and second metal pins, the first metal pins being arranged successively side by side on a first layer such that the first metal pins extend in a first direction and at least two of the first metal pins have a first minimum metal center-to-metal center pitch therebetween that is less than or equal to 80 nm, the second metal pins extending on a second layer in a second direction, the second direction being perpendicular to the first direction, a first one of the first metal pins being connected to a first one of the second metal pins using a first via, and a second one of the first metal pins being connected to a second one of the second metal pins using a second via such that the first via and the second via are separated by a first via center-to-via center space, and place and route a second standard cell in each of the congested regions using a cell layout from the second cell library, the second standard cell including third metal pins and fourth metal pins, the third metal pins being arranged successively side by side on the first layer such that third metal pins extend in the first direction and at least two of the third metal pins have a second minimum metal center-to-metal center pitch therebetween that is less than or equal to 80 nm, the fourth metal pins extending on the second layer in the second direction, a first one of the third metal pins being connected to a first one of the fourth metal pins using a third via, and a second one of the third metal pins being connected to a second one of the fourth metal pins using a fourth via such that the third via and the fourth via are separated by a second via center-to-via center space greater than the first via center-to-via center space such that the first standard cell has different via center-to-via center spaces as compared to the second standard cell to reduce routing congestion while the first minimum metal center-to-metal center pitch associated with the first standard cell is equal to the second minimum metal center-to-metal center pitch associated with the second standard cell.

11. The placement and routing tool of claim 10, wherein the processor is configured to place and route the first standard cell by,
forming first transistors as first FinFETs,
placing the first metal pins successively side by side on the first layer such that the first metal pins extend in the first direction and the at least two of the first metal pins have the first minimum metal center-to-metal center pitch therebetween that is less than or equal to 80 nm,
placing the second metal pins on the second layer such that the second metal pins extend in the second direction, and
connecting the first one of the first metal pins and the first one of the second metal pins using the first via,
connecting the second one of the first metal pins and the second one of the second metal pins using the second via, the first via center-to-via center space between the first via and the second via being greater than double the first minimum metal center-to-metal center pitch.

12. The placement and routing tool of claim 11, wherein the processor is configured to place and route the second standard cell by,
forming second transistors as second FinFETs;
placing the third metal pins successively side by side on the first layer such that third metal pins extend in the first direction and the at least two of the third metal pins have the second minimum metal center-to-metal center pitch therebetween that is less than or equal to 80 nm;
placing the fourth metal pins on the second layer such that the fourth metal pins extend in the second direction;
connecting the first one of the third metal pins and the first one of the fourth metal pins using the third via; and
connecting the second one of the third metal pins and the second one of the fourth metal pins using the fourth via, the second via center-to-via center space between the third via and the fourth via being greater than double the second minimum metal center-to-metal center pitch.

* * * * *

UNITED STATES PATENT AND TRADEMARK OFFICE
CERTIFICATE OF CORRECTION

PATENT NO. : 11,031,385 B2  Page 1 of 1
APPLICATION NO. : 16/725023
DATED : June 8, 2021
INVENTOR(S) : Jae-Woo Seo et al.

It is certified that error appears in the above-identified patent and that said Letters Patent is hereby corrected as shown below:

On the Title Page

At item (72):
"Hyoung-Suk Oh" should read -- Hyeong-Suk Oh --

Signed and Sealed this
Nineteenth Day of October, 2021

Drew Hirshfeld
*Performing the Functions and Duties of the*
*Under Secretary of Commerce for Intellectual Property and*
*Director of the United States Patent and Trademark Office*